US012660206B2

(12) United States Patent
Loy et al.

(10) Patent No.: US 12,660,206 B2
(45) Date of Patent: Jun. 16, 2026

(54) THREE-DIMENSIONAL NON-VOLATILE MEMORY DEVICE WITH FILAMENT CONFINEMENT

(71) Applicant: GlobalFoundries Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 752 days.

(21) Appl. No.: 17/645,454

(22) Filed: Dec. 22, 2021

(65) Prior Publication Data

US 2023/0200091 A1     Jun. 22, 2023

(51) Int. Cl.
| | |
|---|---|
| *H10B 63/00* | (2023.01) |
| *H10N 70/00* | (2023.01) |
| *H10W 20/41* | (2026.01) |
| *H10W 20/42* | (2026.01) |

(52) U.S. Cl.
CPC ........... *H10B 63/84* (2023.02); *H10N 70/011* (2023.02); *H10N 70/841* (2023.02); *H10W 20/42* (2026.01); *H10W 20/435* (2026.01)

(58) Field of Classification Search
CPC ........ H10N 70/821–828; H10N 70/826–8265; G11C 2213/52
See application file for complete search history.

(56) References Cited

U.S. PATENT DOCUMENTS

2020/0006427 A1 * 1/2020 Sato ..................... H10B 63/845

OTHER PUBLICATIONS

Hsu et al., 3D Vertical TaOx/TiO2 RRAM with over 103 Self-Rectifying Ratio and Sub-µA Operating Current, 2013 IEEE International Electron Devices Meeting, 2013, pp. IEDM13-264-267, IEEE.

Wu et al., Low Power Consumption Nanofilamentary ECM and VCM Cells in a Single Sidewall of High-Density VRRAM Arrays, Advanced Science, 2019, pp. 1902363 (1)-1902363 (8), vol. 6—Issue No. 24, Wiley.

* cited by examiner

*Primary Examiner* — Amar Movva
(74) *Attorney, Agent, or Firm* — David Cain

(57) ABSTRACT

A non-volatile memory device and method of making the same is provided. The memory device includes a first electrode, a first hard mask on the first electrode, a second electrode on the first hard mask, a second hard mask on the second electrode, and a third electrode on the second hard mask. A switching layer is over the electrode stack and the switching layer has a first portion conformal to the side surfaces of the electrode stack.

20 Claims, 8 Drawing Sheets

X - X'

Y - Y'

THREE-DIMENSIONAL NON-VOLATILE MEMORY DEVICE WITH FILAMENT CONFINEMENT

FIELD OF THE INVENTION

The present invention relates generally to integrated circuits and fabrication of integrated circuits, and more particularly to structures for a non-volatile memory device and methods of making non-volatile memory devices.

BACKGROUND

Semiconductor memory devices may generally be categorized into volatile memory devices and non-volatile memory devices. Volatile memory devices typically require a continuous supply of power to maintain stored information, whereas non-volatile memory devices are able to retain data even when powered off. Examples of volatile memory devices include static random-access memory (SRAM) and dynamic random-access memory (DRAM). Examples of non-volatile memory devices include flash memory, read-only memory (ROM), non-volatile random-access memory such as resistive random-access memory (ReRAM or RRAM).

A resistive random-access memory can store information via a resistive element between two conductive electrodes, the resistive element having a resistance value that can vary between a high resistance state and a low resistance state, corresponding to different logical values for data storage. For example, to write a logical "1" value, a switching voltage may be applied so as to form one or more filaments within the resistive element, creating a conductive path across the resistive element to provide a low resistance state. Conversely, a switching voltage may be applied to destroy the filaments, thereby removing the conductive path to provide a high resistance state.

With the demand for faster and smaller devices, memory devices have been moving towards higher-density memory structures. For resistive random-access memory devices, higher density memory structures may suffer from variations in the filament formation and destruction process, as well as filament spread, which causes significant variations in the resistance values for the high and low resistance states. This leads to undesirable variations in switching voltages required to program the memory device to switch between a high or low resistance state.

Improved structures for high-density non-volatile memory devices and methods for making such non-volatile memory devices are needed.

SUMMARY

According to an embodiment of the invention, a memory device comprises an electrode stack having side surfaces. The electrode stack comprises a first electrode, a first hard mask on the first electrode, a second electrode on the first hard mask, a second hard mask on the second electrode, and a third electrode on the second hard mask. A switching layer is over the electrode stack and the switching layer has a first portion conformal to the side surfaces of the electrode stack.

According to another embodiment of the invention, a memory device comprises an electrode stack having side surfaces. The electrode stack comprises a first electrode, a first hard mask on the first electrode, a second electrode on the first hard mask, a second hard mask on the second electrode, and a third electrode on the second hard mask.

The side surfaces of the electrode stack include a first side surface and a second side surface opposite to the first side surface, the first side surface and second side surface each having a top width and a bottom width, and the top width is shorter than the bottom width. A switching layer is over the electrode stack, the switching layer having a first portion conformal to the side surfaces of the electrode stack.

According to yet another embodiment of the invention, a method of fabricating a memory device is provided. The method includes forming an electrode stack over an interconnect structure, and forming a switching layer over the electrode stack, the switching layer having a first portion conformal to the side surfaces of the electrode stack. The electrode stack comprises a first electrode, a first hard mask on the first electrode, a second electrode on the first hard mask, a second hard mask on the second electrode, and a third electrode on the second hard mask.

BRIEF DESCRIPTION OF THE DRAWINGS

The accompanying drawings illustrate examples of various non-limiting embodiments of the invention and constitute a part of the specification. The drawings, along with the above general description of the invention, and the following detailed description of the various embodiments, serve to explain the examples of the non-limiting embodiments of the invention. In the drawings, like reference numerals generally refer to like features in the various views.

Figure 1A:
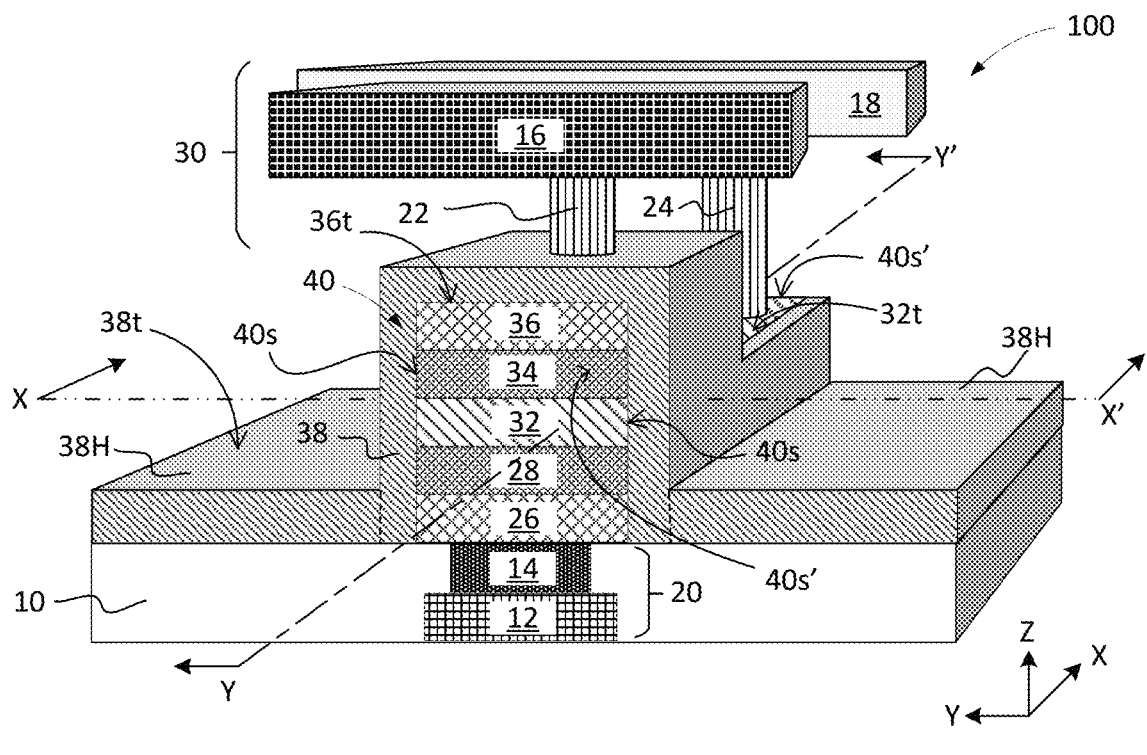
FIG. 1A shows a simplified perspective view of a memory device according to an exemplary embodiment of the invention.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale and the dimensions of some of the elements in the drawings may be exaggerated relative to other elements to help improve understanding of the embodiments of the device.

DETAILED DESCRIPTION

Figure 2:
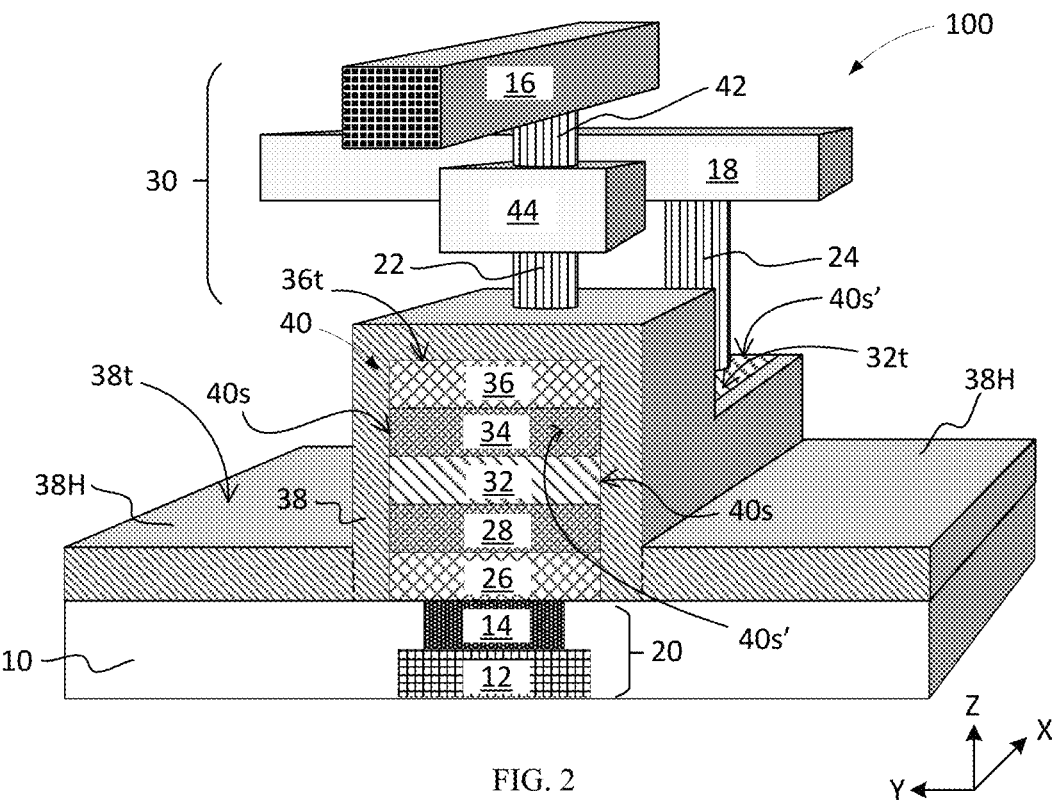
FIG. 2 shows a simplified perspective view of an alternative embodiment according to another aspect of the invention.

Referring to FIG. 1A, in accordance with exemplary embodiments of the invention, a memory device 100 is disposed in a metallization level of an interconnect system fabricated by middle-of-line and back-end-of-line processing over a substrate. The interconnect system may include interconnect structures 20, 30 which are connected to memory device 100. In some embodiments, memory device 100 may be a resistive switching random-access memory cell type, such as oxide random-access memory (Ox-ReRAM or Ox-RRAM) or conductive-bridging random-access memory (CBRAM) as examples. In other embodiments, the top and bottom electrodes of the memory device 100 may be connected to interconnect structures for sending or receiving electrical inputs from other electronic components such as transistors or diodes, as non-limiting examples, in a memory device. The interconnect structures may comprise a metallic material such as copper, cobalt, aluminum, or an alloy thereof, and may include one or more conductive lines, vias, contacts, islands, or the like, arranged in an interlayer dielectric material which may comprise one or more layers. Conductive lines may be source lines, bit lines, or word lines, and each conductive line may be connected to more than one top or bottom electrode, depending on the design requirements of the device. Referring to memory device 100, interconnect structure 20 may include via 14 disposed in an interlayer dielectric material 10 and coupled to a terminal connection, such as a source line 12 as an example. Interconnect structure 30 may include vias 22 and 24 disposed in an interlayer dielectric material 50 (not shown) and each coupled to a different terminal connection. For example, via 22 may be coupled to a bit line 16 and via 24 may be coupled to a different bit line 18 which allows separate programming of the memory device 100. As shown in FIG. 1A, the bit lines 16 and 18 may be arranged substantially parallel to each other, but at an angle to the source line 12, for example, substantially perpendicular to the axis of source line 12. In an alternative embodiment as shown in FIG. 2, the bit line 16 may be arranged to be substantially perpendicular to the bit line 18, but at a different metallization level such that no crossing of the bit lines may occur. In this embodiment, the via 22 may directly connect bit line 16 to the memory device 100 or may be connected through another via 42 and an interconnect structure 44 formed between via 22 and via 42.

Referring back to FIG. 1A, the memory device 100 includes an electrode stack 40 arranged over the top surfaces of the interconnect structure 20 and the interlayer dielectric material 10. The electrode stack 40 includes a bottom electrode 26, a middle electrode 32 and a top electrode 36. Hard masks 28 and 34 are arranged between the electrodes to space them apart. For example, hard mask 28 may be arranged between the bottom electrode 26 and the middle electrode 32, and hard mask 34 may be arranged between the middle electrode 32 and the top electrode 36. The bottom electrode 26, the middle electrode 32 and the top electrode 36 may each have a length along the x-axis, and the length of the top electrode 36 may be shorter than the length of the middle electrode 32. This enables the top electrode 36 to be connected to via 22 while the middle electrode 32 may be connected to via 24 for separate programming capability. In some embodiments, a portion of the hard mask 34 may be removed from the top surface 32t of the middle electrode 32, exposing a portion of the top surface 32t for connection to the via 24. In other embodiments, the length of the hard mask 34 along the x-axis may be substantially the same as the length of top electrode 36. In further embodiments, the length of the hard mask 28 along the x-axis may be substantially the same as the length of the bottom electrode 26 and the length of the middle electrode 32.

The top, middle and bottom electrodes 36, 32 and 26, may comprise an electrically conductive material, for example, a metal or an alloy thereof. The material choice for each of the electrodes may be selected based on factors such as oxidation resistance and work function difference relative to the other electrodes. In an exemplary embodiment, the top electrode 36 and bottom electrode 26 may be active electrodes while the middle electrode 32 may be an inert electrode. In some other embodiments, the top electrode 36 and bottom electrode 26 may be inert electrodes while the middle electrode 32 may be an active electrode. In other embodiments, at least one of the electrodes may be an active electrode, while the other electrodes are inert electrodes. For example, the bottom electrode 26 may be an active electrode, while the middle and top electrodes are inert electrodes. In yet other embodiments, all three electrodes may be the same type of electrodes. For example, the bottom, middle and top electrodes are all active electrodes. An active electrode may comprise a suitable conductive material capable of being oxidized and/or reduced (i.e., redox reactions) to generate electric charges for the formation of the conductive paths. Non-limiting examples of suitable conductive material for the active electrode may include tantalum (Ta), hafnium (Hf), titanium (Ti), copper (Cu), silver (Ag), cobalt (Co), tungsten (W), or an alloy thereof. An inert electrode may be composed of a suitable conductive material being resistant to redox reactions. Non-limiting examples of suitable conductive material for the inert electrode may include ruthenium (Ru), platinum (Pt), titanium nitride (TiN), tantalum nitride (TaN). In further embodiments, the bottom electrode 26 and the top electrode 36 may comprise of the same material while the middle electrode 32 may comprise of a material different from that of the top and bottom electrodes. In some embodiments, the active electrodes may be thicker than the inert electrodes. For example, the top electrode 36 and bottom electrode 26 may each have a thickness within the range of 5-30 nm, while the middle electrode 32 may have a thickness within the range of 5-10 nm. The hard masks 28 and 34 may be composed of a suitable dielectric material, preferably a nitride, such as silicon nitride ($Si_3N_4$), and may be patterned by lithographic and etching techniques. The thickness of the hard masks 28 and 34 may be in the range of 5 nm to 20 nm.

The electrode stack 40 comprises a top surface 36t and at least two side surfaces 40s and 40s'. A switching layer 38 is arranged over the electrode stack 40 and at least a portion of the top surface of the dielectric material 10. For example, the switching layer 38 may have a nominally uniform thickness and conformally cover a side surface 40s of the electrode stack 40. The term "conformal" may refer to when a material layer conforms to or follows the contours of the surface that the material layer is in direct contact with, while maintaining a relatively uniform thickness over the surface. In some embodiments, the switching layer 38 may conformally cover three or more side surfaces of the electrode stack 40. For example, the switching layer 38 may conformally cover the two side surfaces 40s, the side surface 40s' and a bottom portion of the opposite side surface 40s'. In an example of an embodiment, the switching layer 38 may extend to at least partially cover a top surface 36t of the electrode stack 40. In another example, the switching layer 38 may have a horizontal portion 38$_H$ extending over the top surface of the dielectric material 10, the horizontal portion 38$_H$ having a substantially planar top surface 38t. In some embodiments, the portion of the switching layer 38 covering the top surface 36t of the electrode stack and the horizontal portion 38$_H$ may be removed, for example, with a spacer etch process, so that a spacer-like switching layer 38 adjacent to and in contact with the side surfaces of the electrode stack 40 is formed. For example, the top surface 36t of the electrode stack 40 and part of the top surface of the dielectric material 10 is devoid of switching layer 38. In FIG. 1A, the horizontal portion 38$_H$ is demarcated by dotted lines for easy visual identification and may not need to be physically separate from the portion of switching layer 38 adjacent to the side surface 40s of the electrode stack 40. Suitable materials for the switching layer 38 comprise a metal oxide, such as magnesium oxide (MgO), tantalum oxide (TaO$_2$), hafnium oxide (HfO$_2$), titanium oxide (TiO$_2$), aluminum oxide (AlO$_2$ or Al$_2$O$_3$), or silicon dioxide (SiO$_2$). The thickness of the switching layer 38 may be in the range of 2 nm to 10 nm, more preferably between 5 nm to 10 nm.

Figure 1B:
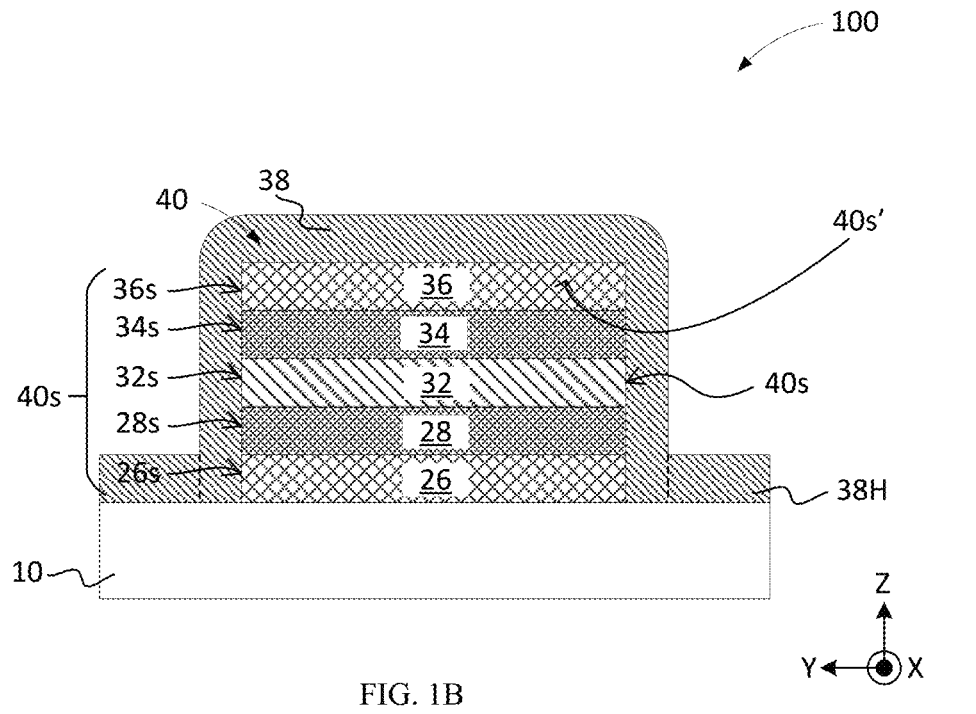
FIGS. 1B and 1C show simplified cross-sectional views of the memory device in FIG. 1A, taken generally along the side surface 40s' for FIG. 1B and side surface 40s for FIG. 1C.
Figure 1C:
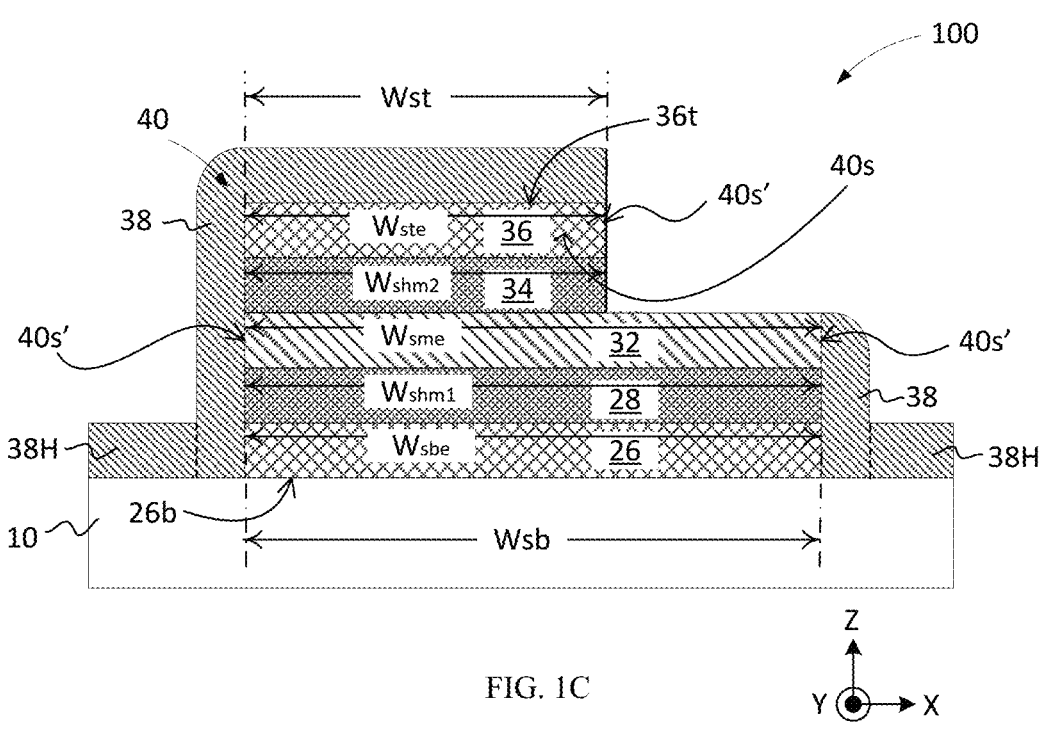

Referring first to FIG. 1B which shows a simplified cross-section of the electrode stack 40 taken along one of the side surfaces 40s', the electrode stack 40 may have two side surfaces 40s that are opposite to each other. Side surface 40s may include the top electrode side surface 36s, the hard mask side surface 34s, the middle electrode side surface 32s, the hard mask side surface 28s and the bottom electrode side surface 26s. The side surfaces 40s may be conformally covered by and in contact with the switching layer 38. In one embodiment, the two side surfaces 40s and 40s' may each be parallel to separate axes that intersect with each other. For example, side surface 40s may be substantially parallel to the X-axis while the side surface 40s' may be substantially parallel to the Y-axis. Now referring to FIG. 1C, a simplified cross-sectional view of the electrode stack 40 along one of the side surfaces 40s is shown. The electrode stack 40 may have two side surfaces 40s' that are opposite to each other, and at least one of the side surface 40s' may be in contact with the switching layer 38. In some embodiments, one of the side surface 40s' may be partially in contact with the switching layer 38. For example, a top portion of the side surface 40s' may be devoid of the switching layer 38, while a bottom portion of the side surface 40s' may be conformally covered by and in contact with the switching layer 38. The side surface 40s may have a top width Wst and a bottom width Wsb. The side surface 40s may comprise the side surfaces 36s, 32s and 26s of the top, middle and bottom electrodes respectively, and the side surfaces 28s and 34s of hard masks 28 and 34. The top electrode side surface 36s may have a width of Wste, the middle electrode side surface 32s may have a width of Wsme, and the bottom electrode side surface 26s may have a width of Wsbe. The hard mask side surface 28s may have a width Wshm$_1$ and the hard mask side surface 34s may have a width Wshm$_2$. In one embodiment, the top width Wst of the electrode stack side surface 40s may be taken along the top surface 36t of the top electrode 36, and the bottom width Wsb may be taken along the bottom surface 26b of the bottom electrode 26. The top width Wst may be substantially the same as the width Wste of the top electrode side surface 36s. The bottom width Wsb may be substantially the same as the width Wsbe of the bottom electrode side surface 26s. The width Wsme of the middle electrode side surface 32s may be substantially the same as the bottom width Wsb. In other embodiments, the top width Wst may be substantially the same as the length of the top electrode 36, taken along the X-axis, and the bottom width Wsb may be substantially the same as the length of the bottom electrode 26, taken along the X-axis. In some embodiments, the top width Wst may not be equal to the bottom width Wsb, for example, the top width Wst may be shorter than the bottom width Wsb.

Figure 3A:
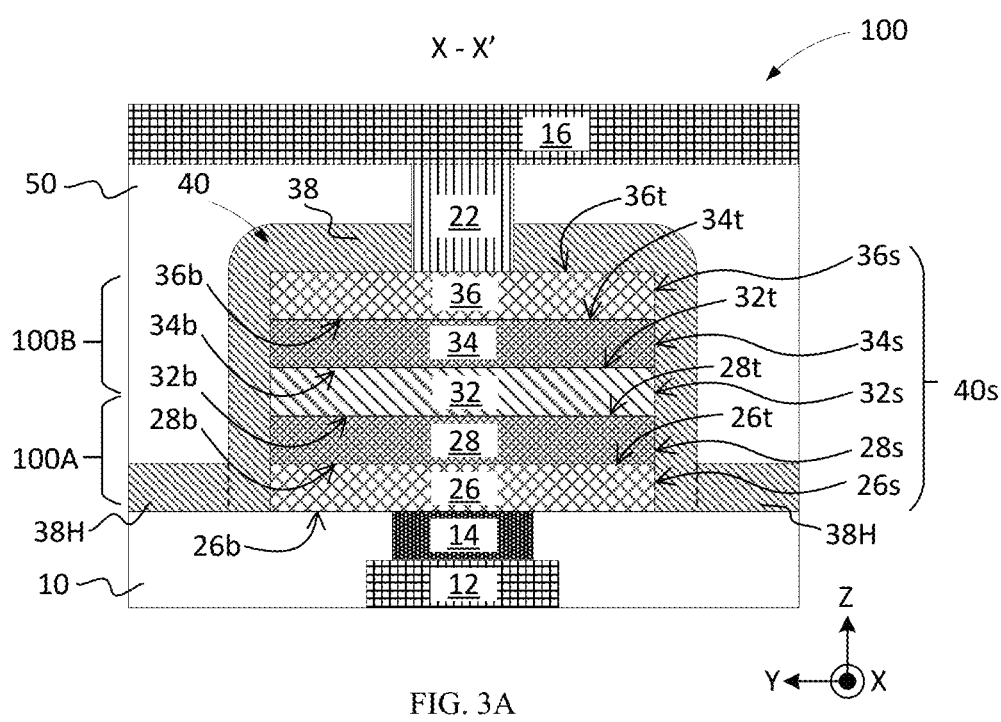
FIG. 3A shows a simplified cross-sectional view of the memory device in FIG. 1A, taken generally along line X-X' in FIG. 1A.

Referring now to FIG. 3A which shows an exemplary simplified cross-section of memory device 100 along line X-X' in FIG. 1A. Memory device 100 includes unit cell 100A and unit cell 100B. Unit cell 100A may comprise the bottom electrode 26, the middle electrode 32 and a portion of the switching layer 38 extending between the bottom and middle electrodes, while unit cell 100B may comprise the middle electrode 32, the top electrode 36 and a portion of the switching layer 38 extending between the middle and top electrodes.

Referring first to unit cell 100A, the bottom electrode 26 may have a bottom surface 26b, a top surface 26t opposite to the bottom surface 26b, and at least one side surface 26s. The bottom electrode 26 may be arranged over via 14 such that at least a portion of the bottom surface 26b is in direct contact with via 14. The hard mask 28 may have a top surface 28t, a bottom surface 28b opposite to the bottom surface 28t and at least one side surface 28s. The hard mask 28 may be arranged over the bottom electrode 26 such that the bottom surface 28b is in direct contact with the top surface 26t of the bottom electrode 26. The middle electrode 32 may have a top surface 32t, a bottom surface 32b opposite the top surface 32t, and at least one side surface 32s. The middle electrode 32 may be arranged over the hard mask 28 such that the bottom surface 32b is in direct contact with the hard mask top surface 28t. In an embodiment, the top surface 26t of the bottom electrode 26 may have substantially the same size as the bottom surface 28b of the hard mask 28. The side surfaces 26s and 28s may be substantially aligned. For example, the side surface 26s of the bottom electrode 26 may be substantially coplanar with the side surface 28s of the hard mask 28. In another embodiment, the top surface 26t of the bottom electrode 26 is larger than the bottom surface 28b of the hard mask 28. The side surfaces 26s and 28s may not be coplanar. For example, the side surface 28s may be recessed from the side surface 26s. In yet another embodiment, the top surface 28t of the hard mask 28 may have substantially the same size as the bottom surface 32b of the middle electrode 32. The side surfaces 28s and 32s may be substantially aligned. For example, the side surface 28s of the hard mask 28 may be substantially coplanar with the side surface 32s of the middle electrode 32. In an alternative embodiment, the top surface 28t of the hard mask 28 may be smaller than the bottom surface 32b of the middle electrode 32. The side surfaces 28s and 32s may not be coplanar. For example, the side surface 28s may be recessed from the side surface 32s.

Now unit cell 100B will be described with reference to FIG. 3A. Another hard mask 34 is arranged over the middle electrode 32 and a top electrode 36 is arranged over the hard mask 34. The hard mask 34 may have a bottom surface 34b, a top surface 34t opposite the bottom surface 34b, and at least one side surface 34s. The bottom surface 34b of the hard mask 34 may be in direct contact with at least a portion of the top surface 32t of the middle electrode. The top electrode 36 may have a bottom surface 36b, a top surface 36t opposite the bottom surface 36b, and at least one side surface 36s. The bottom surface 36b of the top electrode 36 may be in direct contact with the top surface 34t of the hard mask 34. In an embodiment, the top surface 32t of the middle electrode 32 may have substantially the same size as the bottom surface 34b of the hard mask 34. The side surfaces 34s and 36s may be substantially aligned. For example, the side surface 34s of the hard mask 34 may be substantially coplanar with the side surface 36s of the top electrode 36. In another embodiment, the top surface 34t of the hard mask 34 is smaller than the bottom surface 36b of the top electrode 36. The side surfaces 34s and 36s may not be coplanar. For example, the side surface 34s may be recessed from the side surface 36s. In yet another embodiment, the side surface 34s of the hard mask may be substantially coplanar with the side surface 32s of the middle electrode 32. In an exemplary embodiment, the electrode side surfaces 26s, 32s and 36s are substantially aligned or coplanar with the hard mask side surfaces 28s and 34s. In an alternative embodiment, the hard mask surfaces 28s and 34s are recessed from electrode side surfaces 26s, 32s and 36s. As can be seen from FIG. 3A, the side surface 40s of the electrode stack 40 includes the electrode side surfaces 26s, 32s, 36s, and the hard mask side surfaces 28s, 34s. The switching layer 38 arranged over the electrode stack 40 may be in direct contact with each of the electrode side surfaces 26s, 32s and 36s and each of the hard mask side surfaces 28s and 34s. The switching layer 38 may also directly contact the top surface 36t of the top electrode 36 and include a horizontal portion $38_H$ over the dielectric material 10. An interlayer dielectric material 50 may cover the switching layer 38.

Figure 3B:
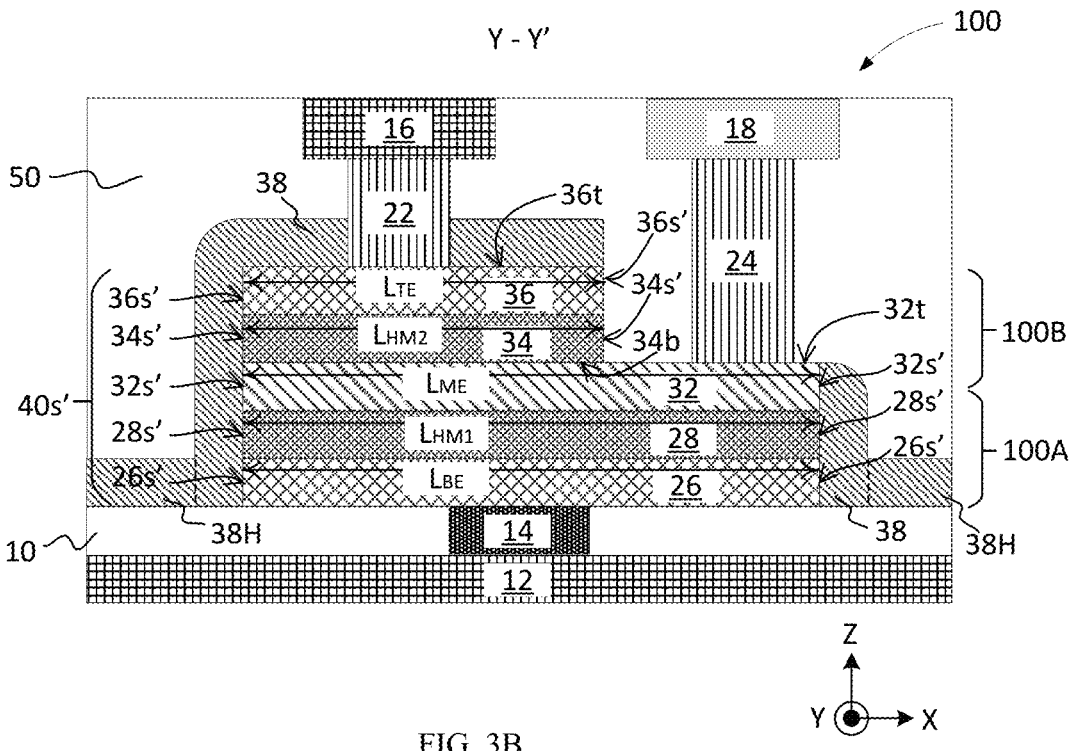
FIG. 3B shows a simplified cross-sectional view of the memory device in FIG. 1A, taken generally along line Y-Y' in FIG. 1A.
Figure 4:
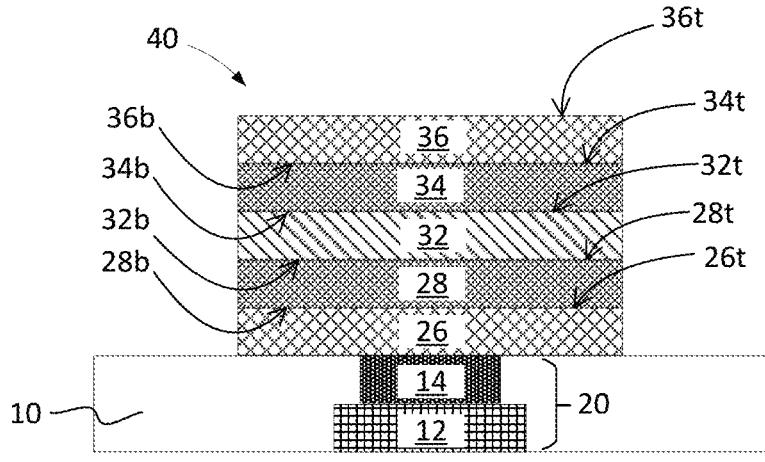
FIGS. 4-6B show simplified cross-sectional views representing exemplary process steps for fabricating a memory device, according to an embodiment of the invention.

Now referring to FIG. 3B which shows an exemplary simplified cross-sectional view of memory device 100 along line Y-Y' in FIG. 1A. The top electrode 36 is coupled to and in direct contact with via 22. The top surface 36t of the top electrode 36 may be covered by switching layer 38. The bottom electrode 26 may have a length $L_{BE}$, the middle electrode may have a length $L_{ME}$, and the top electrode 36 may have a length Lm. The electrode lengths $L_{BE}$, $L_{ME}$ and $L_{TE}$ are substantially parallel to a first axis, which may be the X-axis as an example. In one embodiment, the length $L_{HM1}$ of the hard mask 28 taken along the same axis as the lengths of the electrodes may be substantially the same as the length $L_{BE}$ of the bottom electrode. The length $L_{BE}$ of the bottom electrode and the length $L_{ME}$ of the middle electrode may be substantially the same. For example, the length $L_{HM1}$ of the hard mask 28 may be the same as the lengths $L_{BE}$ and $L_{ME}$ of the bottom and middle electrodes respectively. In an embodiment, the top electrode length $L_{TE}$ may not be equal to the middle electrode length $L_{ME}$. For example, the top electrode length $L_{TE}$ may be shorter than the middle electrode length $L_{ME}$. In another embodiment, the length $L_{HM2}$ of the hard mask 34 taken along the same axis as the lengths of the electrodes may be substantially the same as the length $L_{TE}$ of the top electrode 36. In yet another embodiment, the length $L_{HM2}$ of the hard mask 34 may not be equal to the length $L_{ME}$ of the middle electrode 32. The length $L_{HM2}$ of the hard mask 34 may be shorter than the length $L_{ME}$ of the middle electrode 32 such that a portion of the top surface 32t may be uncovered by the hard mask 34. For example, a portion of the top surface 32t is not in contact with the bottom surface 34b of the hard mask 34. In another example, the length $L_{HM2}$ of the hard mask 34 may be substantially the same as the length $L_{ME}$ of the middle electrode 32 with at least a portion of the top surface 32t in contact with the via 24.

Still referring to FIG. 3B, the electrode stack 40 may have at least a side surface 40s' that is substantially parallel to the Y-axis. For example, the electrode stack 40 may have two side surfaces 40s' which are opposite to each other. The side surface 40s' includes the side surface 26s' of the bottom electrode 26, the side surface 32s' of the middle electrode 32, the side surface 36s' of the top electrode 36, the side surface 28s' of the hard mask 28 and side surface 34s' of the hard mask 34. In one embodiment, at least a portion of a side surface 40s' of the electrode stack 40 may be uncovered by the switching layer 38. For example, a side surface 36s' of the top electrode 36 and a side surface 34s' of the hard mask 34 may be uncovered by the switching layer 38, while the side surfaces 32s', 28s' and 26s', of the middle electrode 32, the hard mask 28 and the bottom electrode 26 respectively, may be covered by and be in direct contact with the switching layer 38. In another example, a first side surface 40s' may be covered by the switching layer 38, while another side surface 40s' opposite to first side surface 40s', may be partially covered by the switching layer 38.

FIGS. 4 through 6B illustrate an exemplary process for making various embodiments of the invention, such as in FIGS. 1A and 2. First referring to FIG. 4, an interconnect structure 20 in a dielectric material 10 may be provided. The interconnect structure 20 may include a via 14 formed over a terminal connection, which may be source line 12. One or more layers of interlayer dielectric material 10 are deposited to surround and electrically isolate the via 14 and source line 12 from other interconnect structures. A material removal process, such as a chemical mechanical planarization (CMP) process may be performed so that the top surface of the via 14 is substantially level with the top surface of the interlayer dielectric material 10, forming a substantially planar surface for subsequent processing. An electrode stack 40 is formed over the top surface of the via 14 and may extend horizontally to cover a portion of the dielectric material 10. The electrode stack 40 may be formed by depositing alternate layers of selected conductive materials and hard mask materials over the top surface of the via 14 and interlayer dielectric material 10. For example, a layer of conductive material selected for the bottom electrode 26 is first deposited over the top surface of via 14 and interlayer dielectric material 10, followed by a layer of hard mask material for hard mask 28, and then followed by another layer of conductive material selected for the middle electrode 32. Another layer of hard mask material for hard mask 34 is deposited over the middle electrode 32, followed by another layer of conductive material selected for the top electrode 36. The conductive materials for each of the electrodes may be deposited by physical vapor deposition (PVD), or any other suitable process. The hard mask material may include a dielectric material, such as silicon dioxide or silicon nitride, and be deposited by a suitable deposition technique such as chemical vapor deposition (CVD). The material stack comprising the alternating layers of conductive material and hard mask material may then be patterned by lithography and etching processes to define the electrode stack 40 having a side surface 40s. As part of the patterning process, another patterning hard mask layer (not shown) may be utilized together with a material removal process such as a reactive ion etching (RIE) process, and subsequently removed from the top surface 36t of the top electrode 36. The patterning hard mask may shield a portion of the alternating material stack underneath the patterning hard mask, such that the material removal process may remove conductive material and hard mask material that are unshielded by the patterning hard mask. It is understood that process limitations may result in slightly sloped sidewalls for the electrode stack 40, as well as rounded edges or corners, in certain instances. In an alternate embodiment, the electrode stack 40 may optionally undergo a further material removal process that may be tuned to achieve increased material removal in the lateral direction for the hard mask materials 28 and 34. This may result in a device structure shown in FIGS. 7A and 7B which will be described in detail later. A suitable material removal process may include a wet etch process.

Figure 5:
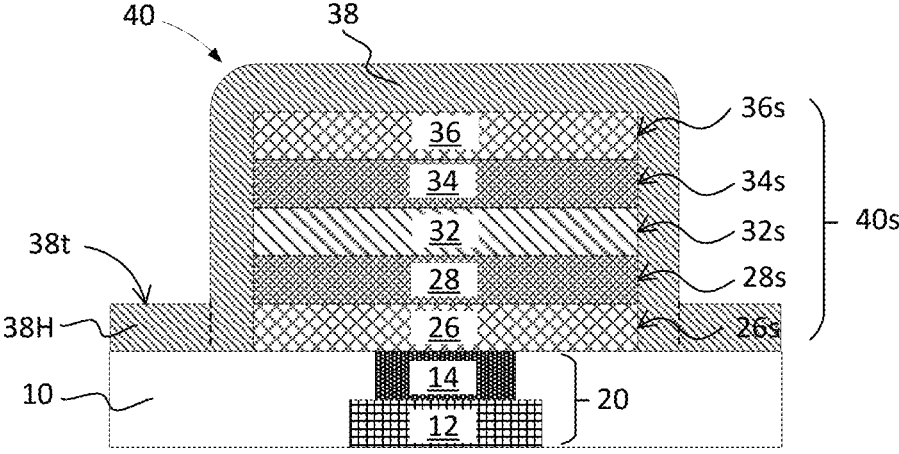

FIG. 5 shows the memory device after subsequent processing steps in which a switching layer 38 may be conformally deposited over top surface 36t of the top electrode 36, the side surfaces 40s of the electrode stack 40 and over the top surface of interlayer dielectric material 10 adjacent to the electrode stack 40. As previously described, the conformally deposited switching layer 38 conforms to or follows the contours of the electrode stack 40. For example, the switching layer 38 is in direct contact with the side surfaces 26s, 32s and 36s of the bottom electrode 26, middle electrode 32 and top electrode 36 respectively, and also in direct contact with the side surfaces 28s and 34s of the hard masks 28 and 34 respectively. The switching layer 38 may additionally be formed to have a horizontal portion 38H extending over the top surface of interlayer dielectric material 10, the horizontal portion 38H having a substantially planar top surface 38t. Suitable conformal deposition methods may include but not limited to atomic layer deposition (ALD) and chemical vapor deposition (CVD).

Figure 6A:
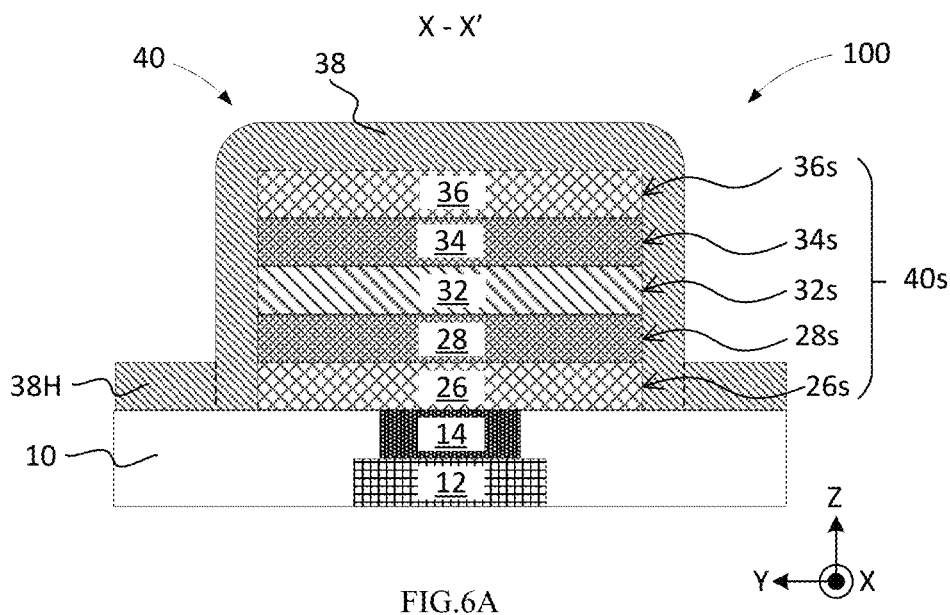
Figure 6B:
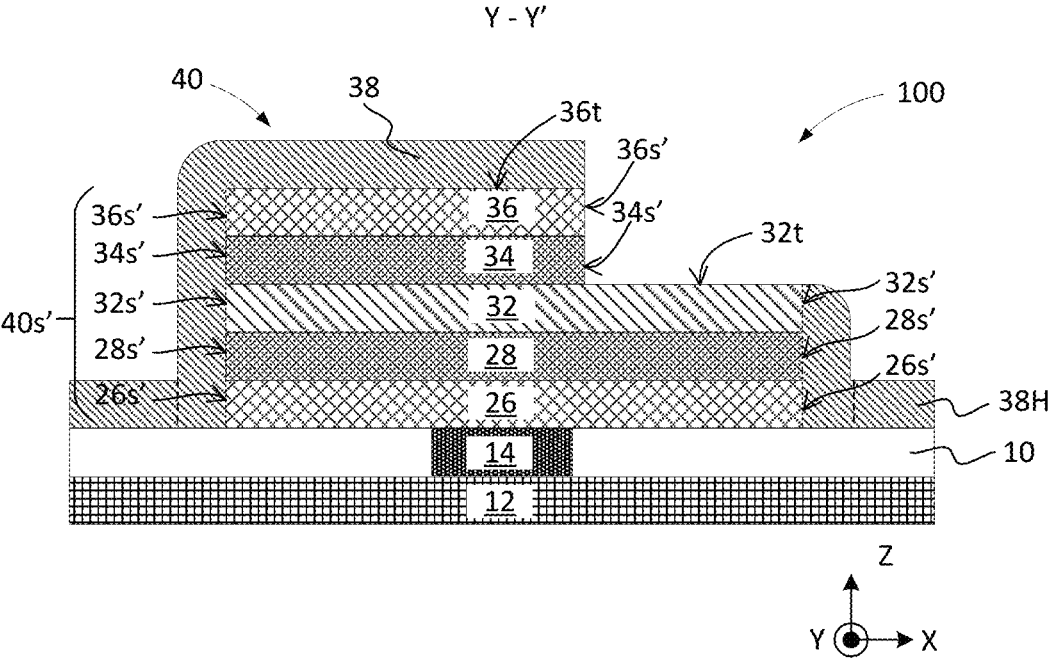

FIGS. 6A and 6B depict the memory device after subsequent processing steps in which a portion of the top electrode 36 is removed. The process may include lithography and etching processes to define the desired shape and dimensions of the top electrode. In an embodiment, the process for partial removal of the top electrode 36 may include removing a portion of the hard mask 34 to expose a portion of the top surface 32t of the middle electrode 32. For example, a patterning hard mask layer (not shown) may be formed over the switching layer 38 to shield a portion of the switching layer 38 and the electrode stack 40, and an etching process may then be performed to form the memory device having the cross-section depicted in FIG. 6B. In an example, the etching process may be an anisotropic etching process which may preferentially remove more unshielded materials from the switching layer 38, top electrode 36 and the hard mask 34 in the vertically downward direction compared to the lateral direction. The anisotropic etching process may also be designed to stop at a top surface 32t of the middle electrode 32. The patterning hard mask layer may then be removed with a suitable process. In an alternative process (not shown), the anisotropic etching process may be designed to stop at the top surface of the hard mask 34. An additional via etch through hard mask 34 to the top surface 32t may then be performed to form a via contact to the middle electrode 32. Subsequently, the process may continue with the formation of interconnect structures such as vias 22 and 24 and bit lines 16 and 18, and deposition of interlayer dielectric material 50 to form the memory device 100 in FIG. 1A or FIG. 2.

Figure 7A:
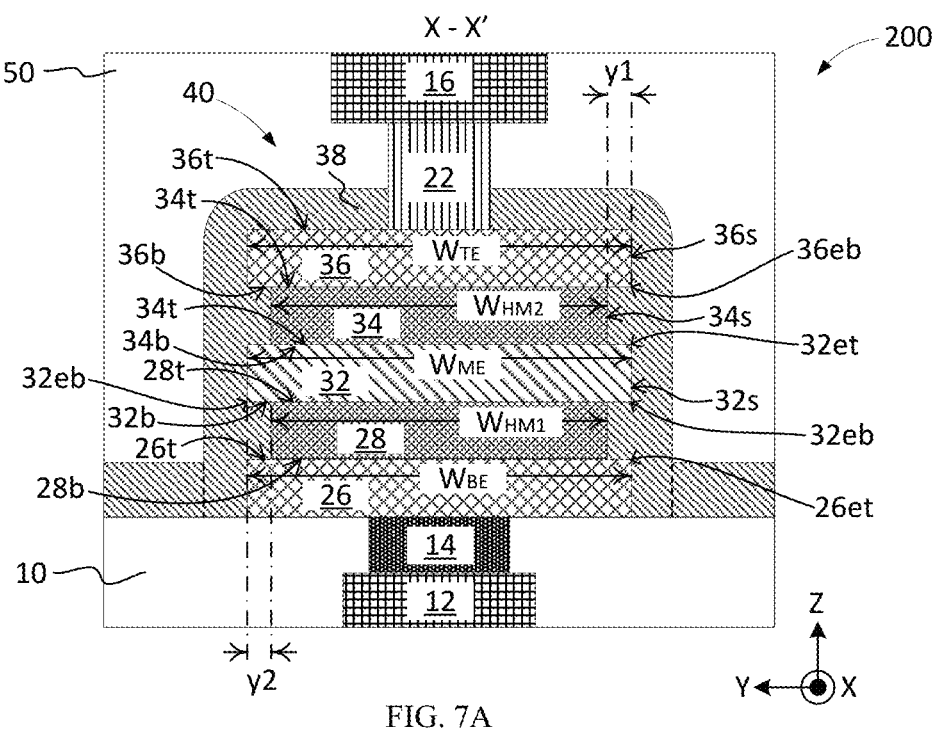
FIGS. 7A and 7B show simplified cross-sectional views of yet another alternative embodiment according to another aspect of the invention, generally corresponding to the cross-sectional views in FIGS. 3A and 3B.

Referring to FIG. 7A in which like reference numerals refer to like features in FIG. 3A and which shows an exemplary cross-sectional view of memory device 200 along line X-X' in accordance with an alternative embodiment. Memory device 200 may include features similar to memory device 100 but may include a modified electrode stack 40 with electrodes having different widths from the hard masks. In an exemplary embodiment, the hard masks may be recessed by performing a wet etch process designed to preferentially remove hard mask material in the lateral direction from the electrode stack 40. The top electrode 36 may have a width $W_{TE}$ that is longer than the width $W_{HM2}$ of the hard mask 34 directly underneath the top electrode 36. The width $W_{HM2}$ of the hard mask 34 may also be shorter than the width $W_{ME}$ of the middle electrode 32. The top surface 34t of the hard mask 34 may be smaller than the bottom surface 36b of the top electrode 36 and the bottom surface of the hard mask 34 may be smaller than the top surface 32t of the middle electrode 32. The shorter width of the hard mask 34 results in a peripheral portion of the top electrode 36 overhanging the hard mask 34 on one or more sides, and a peripheral portion of the top surface 32t of the middle electrode 32 being uncovered by the hard mask 34. For example, the side surface 34s of the hard mask 34 may be recessed from the side surface 36s of the top electrode 36 on one or more sides of the hard mask 34 by a width y1. A bottom edge or corner 36eb of the top electrode 36 may be spaced from the side surface 34s of the hard mask 34 by width y1 and be in contact with the switching layer 38. A top edge or corner 32et of the middle electrode may also be spaced from the side surface 34s of the hard mask 34 and be in contact with the switching layer 38. Still referring to FIG. 7A, the middle electrode 32 may have a width $W_{ME}$ that is longer than the width $W_{HM1}$ of the hard mask 28 between the middle electrode 32 and the bottom electrode 26. The width $W_{HM1}$ of the hard mask 28 may also be shorter than the width $W_{BE}$ of the bottom electrode 26. The shorter width of the hard mask 28 similarly results in a peripheral portion of the middle electrode 32 overhanging the hard mask 28 on one or more sides, and a peripheral portion of the top surface 26t of the bottom electrode 26 being uncovered by the hard mask 28. For example, the side surface 28s of the hard mask 28 may be recessed from the side surface 32s of the middle electrode 32 on one or more sides of the hard mask 28 by a width y2. A bottom edge or corner 32eb of the middle electrode 32 may be spaced from the side surface 28s of the hard mask 28 by width y2 and be in contact with the switching layer 38. A top edge or corner 26et of the bottom electrode 26 may also be spaced from the side surface 28s of the hard mask 28 and be in contact with the switching layer 38. The widths y1 and y2 may each be in the range of 2 nm to 3 nm. In some embodiments, width y1 may be substantially the same as width y2. In other exemplary embodiments, the top electrode width $W_{TE}$ may be substantially the same as the middle electrode width $W_{ME}$. In another embodiment, the middle electrode width $W_{ME}$ may be substantially the same as the bottom electrode width $W_{BE}$. In yet another embodiment, the widths of the top, middle and bottom electrodes are substantially the same, taking into consideration manufacturing allowances due to process variations.

Figure 7B:
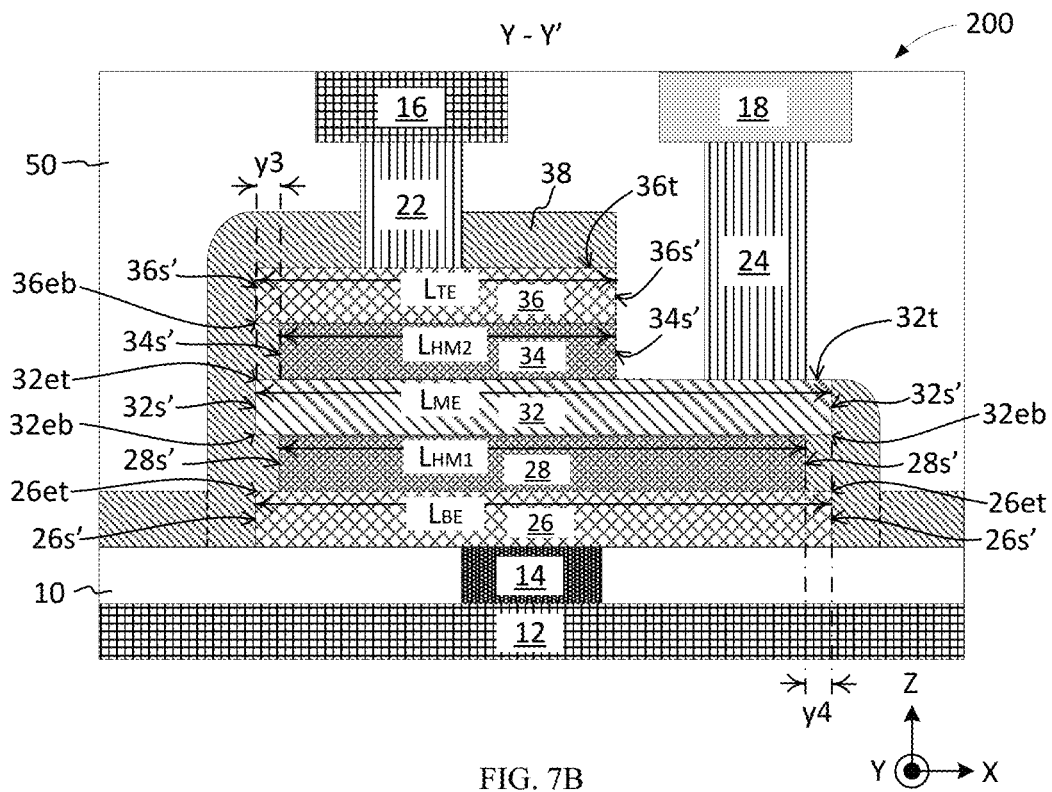

Now referring to FIG. 7B, in which like reference numerals refer to like features in FIG. 3B and which shows an exemplary cross-sectional view of memory device 200 along line Y-Y' in accordance with an alternative embodiment. The length $L_{TE}$ of the top electrode 36 may be longer than the length $L_{HM2}$ of the hard mask 34 directly underneath the top electrode 36. The middle electrode 32 may have a length $L_{ME}$ that is longer than the length $L_{HM1}$ of the hard mask 28 between the middle electrode 32 and the bottom electrode 26. The length $L_{BE}$ of the bottom electrode 26 may also be longer than the length $L_{HM1}$ of the hard mask 28. In some embodiments, the length $L_{ME}$ of the middle electrode 32 is substantially the same as the length $L_{BE}$ of the bottom electrode 26, taking into consideration manufacturing allowances due to process variations. As an example and with reference to FIG. 7B, the side surface 34s' of the hard mask 34 may be recessed from one of the side surface 36s' of the top electrode 36 by a width y3 on one side of the electrode stack, while the side surface 36s' of the top electrode 36 and side surface 34s' of the hard mask 34, are substantially coplanar on an opposite side of the electrode stack. A bottom edge or corner 36eb of the top electrode 36 may be spaced from the side surface 34s' of the hard mask 34 by width y3 and be in contact with the switching layer 38. In some embodiments, width y3 may be substantially the same as width y1. The side surface 28s' of the hard mask 28 may be recessed from the side surface 32s' of the middle electrode 32 on one or more sides of the hard mask 28 by a width y4. A bottom edge or corner 32eb of the middle electrode 32 may be spaced from the side surface 28s' of the hard mask 28 by width y4 and be in contact with the switching layer 38. A top edge or corner 26et of the bottom electrode 26 may also be spaced from the side surface 28s' of the hard mask 28 and be in contact with the switching layer 38. The widths y3 and y4 may each be in the range of 2 nm to 3 nm. In some embodiments, width y3 may be substantially the same as width y4. In other embodiments, widths y1, y2, y3 and y4 are substantially the same, for example, when the etching rate is uniform on all sides, while taking into consideration manufacturing allowances due to process variations.

In use, voltages may be applied to each of the top, middle and bottom electrodes through the conductive lines, in order to read, write or erase the memory device. Referring back to FIG. 3A, in accordance with an aspect of the exemplary embodiment, the bottom electrode 26 and top electrodes may act as active electrodes, and the middle electrode may act as an inert electrode. The memory device 100 may be programmed upon application of selected voltages to the relevant electrodes as desired. First referring to the unit cell 100A comprising the bottom electrode 26, the middle electrode 32 and the switching layer 38 extending between the two electrodes, applying a selected voltage to at least one of the electrodes creates a potential difference across the two electrodes. For example, the voltage applied may be a "SET" voltage, or VSET. One or more conductive filaments may be formed in at least a portion of the switching layer 38 extending between the bottom electrode 26 and middle electrode 32, thereby putting the unit cell 100A into a low resistance state (LRS). When a reverse voltage is applied, for example, a "RESET" voltage or VRESET, such that the conductive filaments can no longer be maintained between the two electrodes and thereby rupturing the conductive path therebetween, the memory device may then be placed into a high resistance state (HRS). In this way, the unit cell 100A can be written, erased or read. Next referring to the unit cell 100B which comprises the top electrode 36, the middle electrode 32 and the switching layer 38 extending between the two electrodes, unit cell 100B may be separately programmed from unit cell 100A by applying selected voltages to the top electrode 36 while the middle electrode 32 is being kept at the same potential for the programming of unit cell 100A. The operation of unit cell 100B with reference to the formation and destruction of filaments is similar to 100A and need not be further elaborated. Confinement of the conductive filaments to a specific region of the switching layer 38 by intentional design, for example, facilitating the formation of filaments at the edge or corners of the electrodes, allows for faster switching behavior between high resistance state (HRS) and low resistance state (LRS), leading to faster reading, writing, and erasing speeds of the memory device, as opposed to conductive filaments forming randomly within the switching layer in an unpredictable manner.

Figure 8:
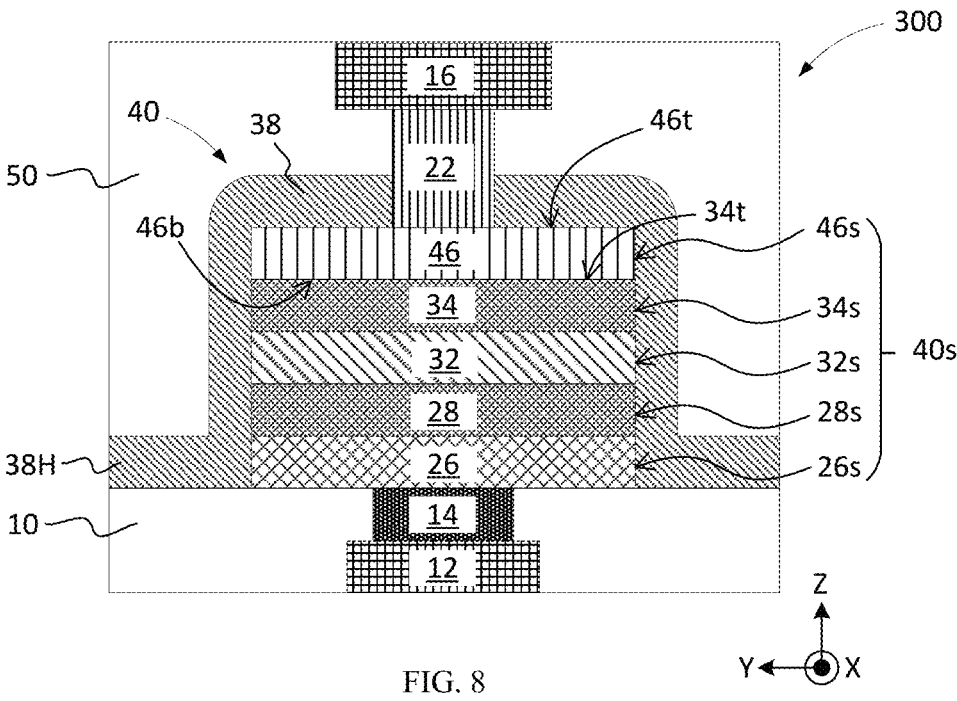
FIG. 8 shows a simplified cross-sectional view of yet another alternative embodiment according to another aspect of the invention.

With reference to FIG. 8 in which like reference numerals refer to like features in FIG. 3A, an exemplary cross-section view of memory device 300 in accordance with an alternative embodiment is provided. Memory device 300 may include features similar to memory device 100 which have already been described and need not be repeated here. Compared to memory device 100, memory device 300 includes a top electrode 46 comprising a material different from the bottom electrode 26 and also different from the middle electrode 32. Top electrode 46 has a top surface 46t which may be covered by and in contact with the switching layer 38. The use of different electrode materials for each of the unit cells may enable better control of cell operations by having different potential values associated with a selected resistance state, for example, a low resistance state in unit cell 100A may correspond to a potential value that is different from the potential value corresponding to the low resistance state in unit cell 100B. Further, for certain electrode materials, additional resistance states may also be enabled by careful study and adjustment of the applied potential values associated with various resistance states. For example, for a single memory cell, a first applied potential value may be associated with a first high resistance state, whereas a second and different applied potential value may be associated with a second high resistance state different from the first high resistance state, providing two different high resistance states associated with two different applied potential values for a single memory cell. For a memory cell comprising two or more unit cells wherein the electrode materials are different, additional multiple resistance states may thus be possible, and may provide better control over cell operations due to the different associated applied potential values.

Figure 9:
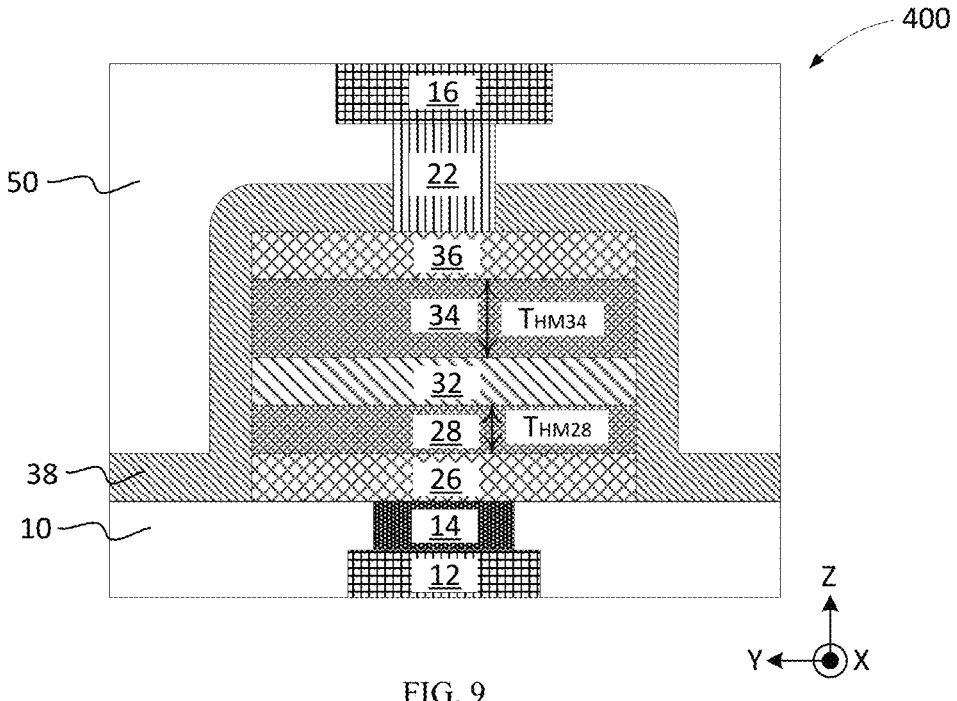
FIG. 9 shows a simplified cross-sectional view of yet another alternative embodiment according to yet another aspect of the invention.

Now referring to FIG. 9 in which like reference numerals refer to like features in FIG. 3A, an exemplary cross-section view of memory device 400 in accordance with an alternative embodiment is provided. Memory device 400 may include features similar to memory device 100 which have already been described and will not be repeated here. Compared to memory device 100, hard masks 28 and 34 may have different thicknesses. For example, the thickness of hard mask 28, $T_{HM28}$, may be thinner than the thickness of hard mask 34, $T_{HM34}$. In another example, the thickness of hard mask 28, $T_{HM28}$, may be thicker than the thickness of hard mask 34, $T_{HM34}$. The difference in hard mask thicknesses results in a difference in the dimensions of the spacing between the top electrode 36 and the middle electrode 32, and the dimensions of the spacing between the middle electrode 32 and the bottom electrode 26. The dimensions of the spacing between electrodes is correlated to the magnitude of the switching voltage of the memory unit cell. For example, a shorter spacing between the electrodes may be associated with a switching voltage having a smaller magnitude than the switching voltage for electrodes separated by a larger spacing. Memory device 400 may be designed to have optimally low switching voltages for both unit cells 100A and 100B by adjusting the thickness of the hard mask materials 28 and 34. This may beneficially allow for improved power or energy savings during operation of the memory cell.

Figure 10:
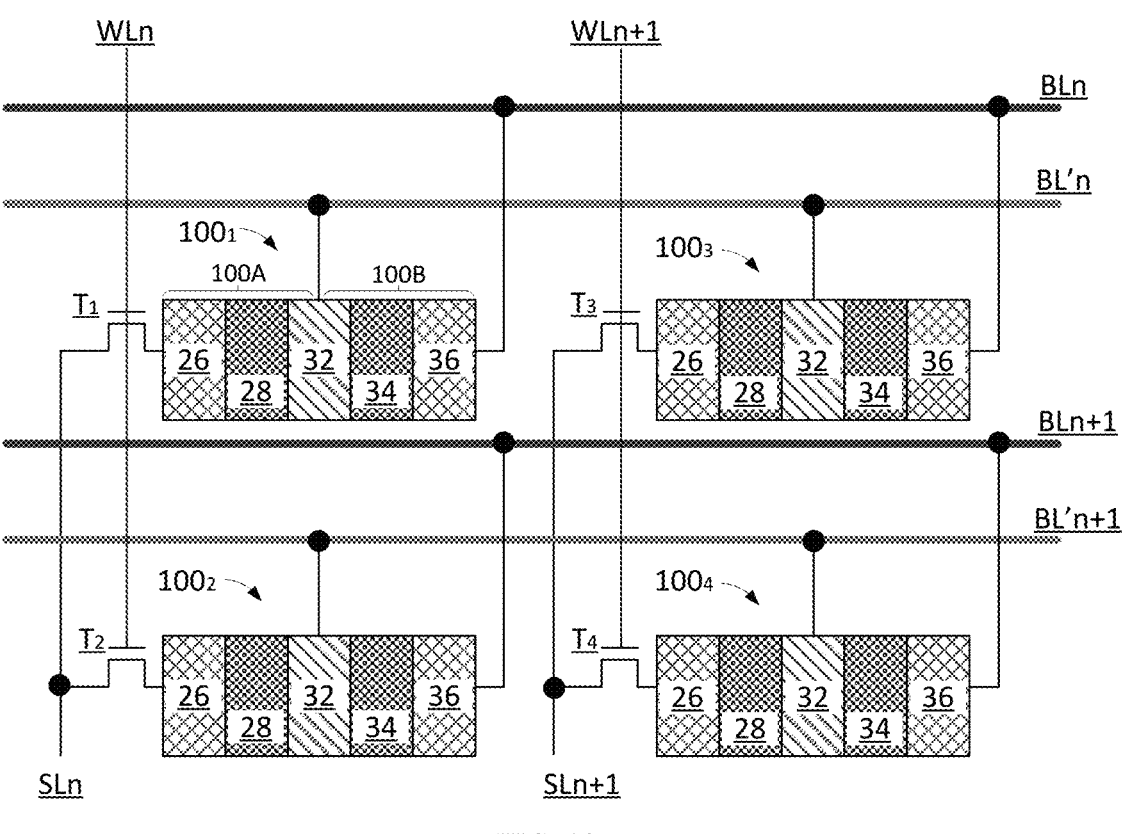
FIG. 10 shows a schematic diagram representing exemplary electrical connections for a memory array, according to an embodiment of the invention.

Referring to FIG. 10 which shows a schematic diagram of a memory array comprising a plurality of memory devices 100 which may be arranged in rows and columns and connected to bit lines that may be arranged substantially perpendicular to word lines and source lines, according to an aspect of the exemplary embodiment. The switching layer 38 has been omitted from the diagram but is understood to be part of the memory device 100. One of the memory devices in the array, memory device 100$_1$ may be coupled to the source line SLn via the transistor T$_1$ at the bottom electrode 26. The transistor T$_1$ may be coupled to the word line, WLn at the transistor gate terminal, such that application of a selected voltage to the word line switches the transistor "on" or "off" to control the current flow through the transistor to the bottom electrode 26. The top electrode 36 may be connected to a first bit line, BLn, while the middle electrode may be connected to a second bit line, BL'n. A second memory device 100$_2$ may similarly have the bottom electrode 26 coupled to the source line, SLn, and the word line, WLn, through another transistor T$_2$, and also have the top electrode 36 connected to a third bit line, BLn+1, and the middle electrode connected to a fourth bit line, BL'n+1. Additional memory devices 100$_3$, 100$_4$, up to memory device 100$_n$ may be connected in the array in a similar manner.

Table 1 below shows a set of electrical signals that may be applied to the aforementioned memory array for various operational states of selected memory cells, in accordance with an exemplary embodiment. For example, starting from pristine state where the memory device is at "0" for both unit cells, to program a selected memory device 100$_1$ to "SET" state for both of the unit cells 100A and 100B, a voltage "V$_{on}$" is applied to turn on the transistor T, allowing current to pass through the transistor. The source line SLn is grounded, or kept at "0" potential, and a voltage "V$_{11}$" is applied to top electrode 36 via the first bit line BLn. The middle electrode connected to the second bit line BL'n is kept at floating potential. The voltage "V$_{11}$" is at a value sufficiently large enough to form filaments across both unit cells 100A and 100B, so that both unit cells are "written" or switched to a low resistance state (LRS), as represented by the "(11)" in the operation table.

To write to only one of unit cells, or to set the device to "RESET (10)" state, for example, from pristine state in which both unit cells are at "0" to where filament formation occurs in only one of the unit cells, a voltage "V$_{on}$" is applied to the word line to turn on the transistor T to allow current flow, the source line SLn is kept at "0" potential, and a voltage "V$_{10}$" is applied to the first bit line BLn. The second bit line BL'n is kept at floating potential. The voltage "V$_{10}$" is at a value that is sufficiently large enough to form filaments across only one unit cell, for example, unit cell 100A, switching it to a low resistance state (LRS), while the other unit cell, for example, unit cell 100B remains in high resistance state (HRS) as no filaments are formed from the middle electrode 32 to the top electrode 36 for unit cell 100B. The magnitude of voltage "V$_{10}$" is at a smaller value than voltage "V$_{11}$". In some embodiments, V$_{10}$ may be approximately half the magnitude of V$_{11}$.

To erase both unit cells, or to set the device to "RESET (00)" state, for example, to destroy or not sustain formation of filaments in both unit cells, a voltage "Von" is applied to the word line to turn on the transistor T to allow current flow, a voltage "V$_{00}$" is applied to the source line SLn, while the bit lines are kept at "0" potential. The first bit line BLn may alternatively be floated. This destroys any filaments previously formed and places both unit cells 100A and 100B into high resistance state (HRS), thus erasing both unit cells. In some embodiments where each of the memory unit cells 100A and 100B are symmetrical, for example in the case where the electrodes for each unit cell are comprised of the same materials, the magnitude of voltage "V$_{00}$" may be substantially the same as the magnitude of voltage "V$_{11}$" but of a different polarity. In other embodiments where the memory unit cells are asymmetric, for example in the case where the electrodes for each unit cell are comprised of different materials, the magnitude of voltage "V$_{00}$" may be different from the magnitude of voltage "V$_{11}$".

To read a selected device, the transistor T is turned on by application of V$_{on}$ to the word line WLn, keeping source line SLn at "0" potential, and applying a voltage "V$_{read}$" to the first bit line BLn, with the second bit line being either floated, or kept at "V$_{read}$" potential. The magnitude of the voltage "V$_{read}$" is smaller than the magnitude of voltage "V$_{10}$. In some embodiments, the magnitude of "V$_{read}$" may be approximately a quarter of the magnitude of "V$_{10}$".

For unselected devices, the transistor T is turned off such that the transistor does not allow current flow to the bottom electrode 26. A counter voltage may still be applied to respective bit lines to counter the potential applied to the common source line SLn, so as to mitigate any breakdown incidents.

TABLE 1

| Operation | Source Line (SL)/V | Word Line (WL)/V | Bit Line (BL)/V | Bit Line' (BL')/V |
|---|---|---|---|---|
| SET (11) | 0 | V$_{on}$ | V$_{11}$ | Float |
| RESET (10) | 0 | V$_{on}$ | V$_{10}$ | Float |
| RESET (01) | V$_{01}$ | V$_{on}$ | 0 | Float |
| RESET (00) | V$_{00}$ | V$_{on}$ | 0/Float | 0 |
| READ | 0 | V$_{on}$ | V$_{read}$ | Float/V$_{read}$ |

Figure 11:
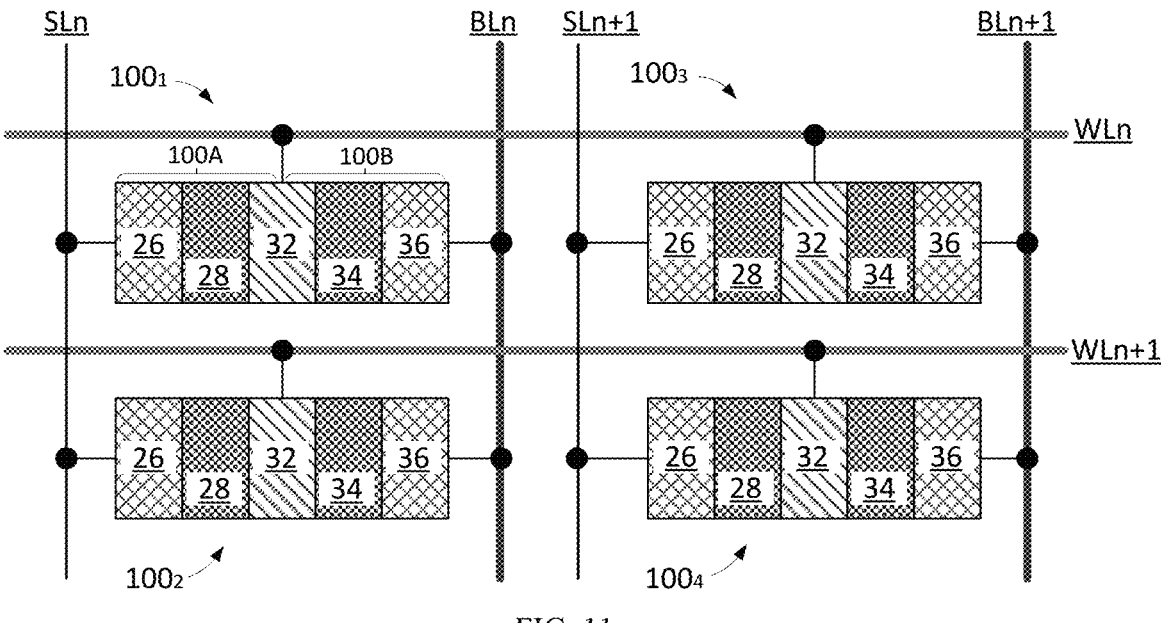
FIG. 11 shows a schematic diagram representing exemplary electrical connections for a memory array, according to another embodiment of the invention.

Referring now to FIG. 11 which shows a schematic diagram of a memory array comprising a plurality of memory devices 100 connected to bit lines that may be arranged substantially perpendicular to word lines and substantially parallel to source lines, according to an aspect of the exemplary embodiment. As for FIG. 10, the switching layer 38 has been omitted from the diagram but is understood to be part of the memory device 100. One of the memory devices in the array, memory device 100$_1$ may be coupled to a source line SLn at the bottom electrode 26 and a bit line BLn at the top electrode 36. A word line WLn is coupled to the middle electrode 32. A second memory device 100$_2$ may be coupled to the same source line SLn at the bottom electrode 26 and the same bit line BLn at the top electrode 36 but having the middle electrode 32 being connected to a different word line WLn+1, allowing separate programming from memory device 100$_1$. Additional memory devices 100$_3$, 100$_4$, up to memory device 100$n$ may be connected in the array in a similar manner.

Table 2 below shows a set of electrical signals that may be applied to the memory array in FIG. 11 for various operational states of the selected memory cells, in accordance with an exemplary embodiment. For example, starting from pristine state where both unit cells are at "0", to program a selected memory device 100 to "SET" state for both of the unit cells 100A and 100B, a voltage "V$_{11}$" is applied to top electrode 36 via the bit line BLn while the bottom electrode 26 is kept at "0" potential via the source line SLn. The middle electrode connected to the word line WLn is floated. The voltage "V$_{11}$" is at a value sufficiently large enough to form filaments across both unit cells 100A and 100B, so that both unit cells are "written" or switched to a low resistance state (LRS), as represented by the "(11)" in the operation table.

To write to only one of unit cells, or to set the device to "RESET (01)" state, for example, from pristine state where both unit cells are at "0" to where filament formation occurs in only one of the unit cells, a voltage "$V_{01}$" is applied to each of the word line WLn and the source line SLn, while the bit line BLn is kept at "0" potential. This creates a potential difference across unit cell 100B, forming filaments in unit cell 100B and thus switching the unit cell 100B to a low resistance state (LRS). As there is no potential difference created across unit cell 100A, no filaments are formed in unit cell 100A and thus unit cell 100B remains in a high resistance state (HRS). The magnitude of voltage "$V_{01}$" is at a smaller value than voltage "$V_{11}$". In some embodiments, $V_{01}$ may be approximately half the magnitude of voltage "$V_{11}$".

To erase both unit cells, or to set the device to "RESET (00)" state, for example, to destroy or not sustain formation of filaments in both unit cells, a voltage "$V_{00}$" is applied to the source line SLn, while the word line WLn and bit line BLn are both kept at "0" potential. The reverse applied potential destroys any filaments previously formed in both unit cells and places both unit cells 100A and 100B into high resistance state (HRS), thus erasing both unit cells. As previously described, depending on the electrode materials, in some embodiments, the magnitude of voltage "$V_{00}$" may be substantially similar to the magnitude of voltage "$V_{11}$" but of a different polarity so as to create a reverse potential across the unit cells. In other embodiments, the magnitude of voltage "$V_{00}$" may be different from the magnitude of voltage "$V_{11}$".

To read a selected device, a voltage "$V_{read}$" is applied to the bit line BLn, while the word line WLn is floated and the source line SLn is kept at "0" potential. The magnitude of the voltage "$V_{read}$" is smaller than the magnitude of voltage "$V_{01}$". In some embodiments, the magnitude of "$V_{read}$" may be approximately a quarter of the magnitude of "$V_{01}$".

For unselected devices, a counter voltage may still be applied to respective word line, source line or bit line to counter the programming potential applied to the selected word line, source line or bit line as the case may be, to prevent unwanted filament formation in unselected devices, or to mitigate any breakdown incidents.

TABLE 2

| Operation | Source Line (SL)/V | Word Line (WL)/V | Bit Line (BL)/V |
|---|---|---|---|
| SET (11) | 0 | float | $V_{11}$ |
| RESET (10) | 0 | $V_{10}$ | $V_{10}$ |
| RESET (01) | $V_{01}$ | $V_{01}$ | 0 |
| RESET (00) | $V_{00}$ | float | 0 |
| READ | 0 | float | $V_{read}$ |

Descriptions of embodiments herein are meant to be taken as examples and not meant to be limiting as such. Terms such as "vertical", "horizontal", "top", "bottom", "over", "under", and the like in the description and in the claims, if any, are used for establishing a frame of reference and not necessarily for describing permanent relative positions. The term "horizontal" is defined as a plane parallel to a conventional plane of a semiconductor substrate, rather than its actual three-dimensional orientation in space. The terms "vertical" and "normal" refer to a plane perpendicular to the horizontal. The term "lateral" refers to a direction parallel to the horizontal plane.

Terms such as "connected" or "coupled" indicate that a feature may be directly connected or coupled to or with the other feature, or one or more intervening features may also be present. A feature may be "directly connected" or "directly coupled" to or with another feature if intervening features are absent. A feature may be "indirectly connected" or "indirectly coupled" to or with another feature if at least one intervening feature is present. Terms such as "on" or "contacting" indicate that a feature may be directly on or in direct contact with the other feature, or one or more intervening features may also be present. A feature may be "directly on" or in "direct contact" with another feature if intervening features are absent. A feature may be "indirectly on" or in "indirect contact" with another feature if at least one intervening feature is present.

The terms "first", "second", "third" and the like in the description and in the claims, if any, are used for distinguishing between similar elements and not necessarily for describing a particular sequential or chronological order as required. A method described herein is not necessarily limited in practice to the exact order or number of steps as have been listed, and certain steps may possibly be omitted and/or certain other steps not described herein may possibly be performed in actual practice. Terms such as "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device comprising:
   an electrode stack having a first side surface and a second side surface opposite the first side surface, the electrode stack comprising
   a first electrode, a first hard mask on the first electrode, a second electrode on the first hard mask, a second hard mask on the second electrode, and a third electrode on the second hard mask;
   a switching layer over the electrode stack, the switching layer having a first portion conformal to the first side surface and the second side surface of the electrode stack, wherein the third electrode has a top surface; and
   a first conductive via electrically coupled to the top surface of the third electrode between the first side surface and the second side surface of the electrode stack.

2. The memory device of claim 1, wherein the first electrode has a first length substantially parallel to a first axis, the second electrode has a second length substantially parallel to the first axis, the third electrode has a third length substantially parallel to the first axis, and the third length is not equal to the first length.

3. The memory device of claim 2, wherein the second length is substantially the same as the first length.

4. The memory device of claim 2, wherein the third length is shorter than the first length.

5. The memory device of claim 1, wherein the first electrode has a top surface, the first hard mask has a bottom surface in contact with the top surface of the first electrode, and the top surface of the first electrode is larger than the bottom surface of the first hard mask.

6. The memory device of claim 1, wherein the third electrode has a bottom surface, the second hard mask has a top surface in contact with the bottom surface of the third electrode, and the bottom surface of the third electrode is larger than the top surface of the second hard mask.

7. The memory device of claim 1, wherein the first hard mask has a first thickness and the second hard mask has a thickness different from the first thickness.

8. The memory device of claim 1, wherein the first electrode and the second electrode comprise different materials.

9. The memory device of claim 1, wherein the first electrode and the third electrode comprise same materials.

10. The memory device of claim 1, wherein the first electrode and the third electrode comprise different materials.

11. The memory device of claim 1, wherein the switching layer has a second portion arranged over the top surface of the third electrode and the first conductive via extends through the switching layer to directly and electrically contact the top surface of the third electrode.

12. The memory device of claim 1, wherein the first electrode has a bottom surface in direct contact with a second via.

13. A memory device comprising:

an electrode stack having a first side surface and a second side surface opposite the first side surface, the electrode stack comprising a first electrode, a first hard mask on the first electrode, a second electrode on the first hard mask, a second hard mask on the second electrode, and a third electrode on the second hard mask, wherein the side surfaces include a first side surface and a second side surface opposite to the first side surface, the first side surface and the second side surface each having a top width and a bottom width, and the top width is shorter than the bottom width;

a switching layer over the electrode stack, the switching layer having a first portion conformal to the first side surface and the second side surface of the electrode stack, wherein the third electrode has a top surface; and a first conductive via electrically coupled to the top surface of the third electrode between the first side surface and the second side surface of the electrode stack.

14. The memory device of claim 13, wherein the side surfaces of the electrode stack comprise a first electrode side surface, a first hard mask side surface, a second electrode side surface, a second hard mask side surface, and a third electrode side surface.

15. The memory device of claim 14, wherein the first electrode side surface has a first width substantially the same as the bottom width, and the second electrode side surface has a second width substantially the same as the bottom width.

16. The memory device of claim 15, wherein the third electrode side surface has a third width substantially the same as the top width.

17. A method of fabricating a memory device comprising:

forming an electrode stack over an interconnect structure, wherein the electrode stack has a first side surface and a second side surface opposite the first side surface and comprises a first electrode, a first hard mask on the first electrode, a second electrode on the first hard mask, a second hard mask on the second electrode, and a third electrode on the second hard mask;

forming a switching layer over the electrode stack, the switching layer having a first portion conformal to the first side surface and the second side surface of the electrode stack, wherein the third electrode has a top surface; and a first conductive via electrically coupled to the top surface of the third electrode between the first side surface and the second side surface of the electrode stack.

18. The method of claim 17, wherein the forming of the electrode stack comprises forming of a material stack including a first conductive material over the interconnect structure, a first hard mask material over the first conductive material, a second conductive material over the first hard mask material, a second hard mask material over the second conductive material, and a third conductive material over the second hard mask, and patterning the material stack to form the electrode stack.

19. The method of claim 17, wherein the second electrode has a top surface and the electrode stack is further patterned to expose a portion of the top surface of the second electrode.

20. The method of claim 17, wherein the first electrode has a first length parallel to a first axis, the third electrode has a length parallel to the first axis, and the length of the third electrode is not equal to the first length.

* * * * *